United States Patent [19]

Hanak

[11] 4,316,049
[45] Feb. 16, 1982

[54] HIGH VOLTAGE SERIES CONNECTED TANDEM JUNCTION SOLAR BATTERY

[75] Inventor: Joseph J. Hanak, Lawrenceville, N.J.

[73] Assignee: RCA Corporation, New York, N.Y.

[21] Appl. No.: 192,333

[22] Filed: Sep. 29, 1980

Related U.S. Application Data

[63] Continuation-in-part of Ser. No. 70,513, Aug. 28, 1979, abandoned.

[51] Int. Cl.$^3$ ............................................ H01L 31/06
[52] U.S. Cl. .................................... 136/244; 136/255; 136/258; 357/2; 357/30
[58] Field of Search ............... 136/244, 249, 255, 258; 357/2, 30

[56] References Cited

U.S. PATENT DOCUMENTS

| | | | |
|---|---|---|---|
| 2,949,498 | 8/1960 | Jackson | 136/89 |
| 3,186,873 | 6/1965 | Dunlap, Jr. | 136/89 |
| 3,483,038 | 12/1969 | Hui et al. | 136/89 |
| 3,977,904 | 8/1976 | Köhler | 136/89 |
| 4,064,521 | 12/1977 | Carlson | 357/2 |
| 4,190,852 | 2/1980 | Warner, Jr. | 357/30 |

FOREIGN PATENT DOCUMENTS 1564935 10/1975 Fed. Rep. of Germany ........ 136/89

OTHER PUBLICATIONS

Y. Uchida et al., *Electronic Materials*, (Japan), Feb. 1980, pp. 125–131.
Y. Kuwano et al., *Electronic Materials*, (Japan), May 1979, pp. 77–84.
Y. Uchida et al., *Electronic Materials*, (Japan), Sep. 1979, pp. 111–115.
"Use of the Sun's Energy", (Japan), Chapter 2, pp. 35–44, Dec. 1979.
D. E. Carlson, "Amorphous Silicon Solar Cells", Quarterly Report No. 6, DOE Contract EY-76-C-03-1286, Jun. 1978, pp. 23–26.
Y. Kuwano, "Amorphous Silicon Solar Cells Meet Low Cost Energy Requirements", *Journal of Electronic Engineering*, vol. 16, pp. 65–68, (Jul. 1979).
Y. Hamakawa et al., "A New Type of Amorphous Silicon Photovoltaic Cell Generating More than 2.0 V ", *Appl. Phys. Lett.*, vol. 35, pp. 187–189, (Jul. 1979).
"Amorphous Silicon Solar Cells", Sanyo Electric Co., Ltd. (1979).
Y. Kuwano et al., "Amorphous Si Photovoltaic Cells & Cell Module", Presented at RCA Laboratories, Princeton, N.J., Aug. 22, 1979.
Y. Kuwano et al., "Amorphous Si Photovoltaic Cells & Horizontal Cascade Type Cell Module", date unknown.
L. M. Fraas et al., "Design of High Efficiency Monolithic Stacked Multijunction Solar Cells", *Conf. Record 13th IEEE Photovoltaic Specialists Conf.*, (1978), pp. 886–891.

*Primary Examiner*—Aaron Weisstuch
*Attorney, Agent, or Firm*—Birgit E. Morris; Donald S. Cohen; Sanford J. Asman

[57] ABSTRACT

A high voltage series connected tandem junction solar battery which comprises a plurality of strips of tandem junction solar cells of hydrogenated amorphous silicon having one optical path and electrically interconnected by a tunnel junction. The layers of hydrogenated amorphous silicon, arranged in a tandem configuration, can have the same bandgap or differing bandgaps. The tandem junction strip solar cells are series connected to produce a solar battery of any desired voltage.

16 Claims, 1 Drawing Figure

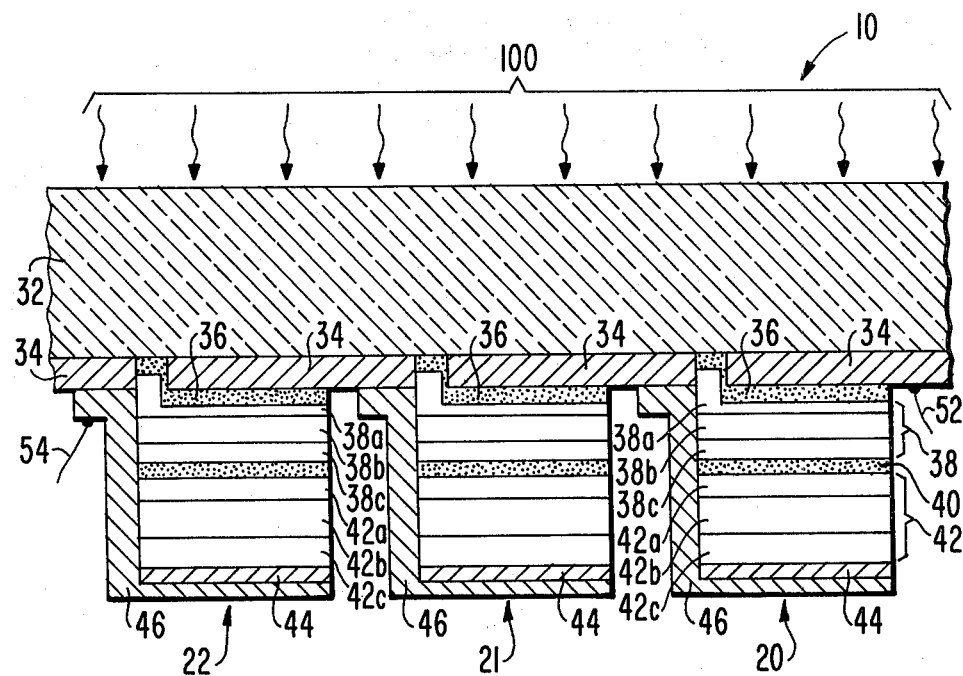

HIGH VOLTAGE SERIES CONNECTED TANDEM JUNCTION SOLAR BATTERY

The Government has rights in this invention pursuant to Contract No. ET-78-C-03-2219 awarded by the Department of Energy.

This is a continuation-in-part of application Ser. No. 070,513, filed Aug. 28, 1979 now abandoned.

BACKGROUND OF THE INVENTION

The present invention relates to amorphous silicon solar cells.

Solar cells are photovoltaic devices which are capable of converting solar radiation into usable electrical energy. The energy conversion occurs as a result of what is well-known in the solar cell field as the "photovoltaic effect". When solar radiation impinges on a solar cell, it is absorbed by the active region of the cell, causing electrons and holes to be generated. The electrons and holes are separated by the electric field resulting from the PIN junction in the solar cell. The electric field is inherent in a semiconductor layer adjacent regions of P type, intrinsic, and N type hydrogenated amorphous silicon. Absorption of solar radiation of the appropriate wavelength produces electron-hole pairs in the intrinisic region of the semiconductor layer. The separation of the electron-hole pairs, with the electrons flowing toward the region of N type conductivity, and the holes flowing toward the region of P type conductivity gives rise to the photovoltage and photocurrent of the cell. The overall performance of the solar cell is maximized by increasing the total number of photons of differing energy which are absorbed by the semiconductor device.

I invented and disclosed in U.S. Pat. No. 4,272,641, issued June 9, 1981, and entitled "Tandem Junction Amorphous Silicon Solar Cells," incorporated herein by reference, a tandem-junction structure for an improved amorphous silicon solar cell. The structure comprises two or more layers of hydrogenated amorphous silicon arranged in a tandem, stacked configuration with one optical path which are electrically interconnected by a tunnel junction. The layers of hydrogenated amorphous silicon include regions of differing conductivity which provide a built-in electric field in each semiconductor layer. The layers can have the same or, in a preferred embodiment, differing bandgaps to absorb more completely the distribution of photons of different energies in the solar spectrum. Thus, my solar cell structure exhibits increased performance through absorption of a greater portion of the solar spectrum. However, a grid electrode is required in large-area solar cells to collect the photocurrent. The grid electrode can shield up to about 10 percent of the active region of the solar cell from the available solar radiation. In addition, as the solar cell area and the current from the solar cell increase, the complexity of the grid electrode also increases. As a result there is a practical limitation on the area of a solar cell.

Thus, it would be highly desirable to have a structure which could maximize the absorption of solar radiation without the shielding effect and area limitations of the grid electrode.

SUMMARY OF THE INVENTION

An amorphous silicon solar battery comprises a plurality of series-connected, tandem-junction solar cell strips wherein said tandem-junction solar cell strips comprise a plurality of layers of hydrogenated amorphous silicon joined together in a tandem, stacked configuration. The cells may be joined together by a metal layer, a cermet layer, a combined metal and cermet layer, or a PN junction. The thickness of the amorphous silicon layers is adjusted to maximize the efficiency and to equalize the current in each layer. There is no basic limit to the length of the solar cell strips. The width of the strips is selected so that a grid electrode is not needed to collect the current generated by the solar battery. The bandgap of the hydrogenated amorphous silicon layers of the solar cell closest to the incident solar radiation can be made higher than the bandgap of the hydrogenated amorphous silicon layers in subsequent solar cells in order to utilize a wider range of the solar spectrum. The bandgap may be adjusted over a range from about 1.8 eV to about 1.5 eV by adjusting the hydrogen concentration in the amorphous silicon layers. The layers with the higher hydrogen concentration will have the higher bandgap.

BRIEF DESCRIPTION OF THE DRAWING

The FIGURE illustrates a cross-sectional view of a high voltage solar battery manufactured in accordance with the invention.

DETAILED DESCRIPTION OF THE INVENTION

The invention will be more clearly illustrated by referring to the FIGURE. A high voltage, tandem-junction, series-connected solar battery is depicted as solar battery 10. Solar radiation 100 impinging on the surface of solar battery 10 establishes a reference point for the incident surface 60 of the solar battery 10. The solar battery 10 includes a transparent substrate 32 of a material such as ordinary window glass or a borosilicate glass. A plurality of strips 34 of a transparent conductive oxide (TCO), such as indium tin oxide (ITO), or other, similar material is formed on the substrate 32. The strips 34 form the top electrodes for a plurality of series-connected, tandem-junction, hydrogenated amorphous silicon solar cell strips 20, 21, and 22. The TCO strips should be as thin as possible to transmit the maximum amount of solar radiation. However, the thickness should be adjusted to achieve a sheet resistivity not greater than about $150\Omega/\square$. Preferably, the sheet resistivity is less than $50\Omega/\square$. The thickness of the TCO layers can be selected to take advantage of their antireflection properties. Since solar cell strips 20, 21, 22 are equivalent, solar cell strip 20 will be described in detail with the equivalent labeling for solar cell strips 21 and 22.

Solar cell strip 20 incorporates a cermet layer 36 which electrically contacts the TCO layer 34. The cermet layer 36 is a material, such as $Pt-SiO_2$, which is a physical mixture of platinum and silicon dioxide which contains from about 7 to about 15 volume percent of platinum and which has a thickness of from about 5 to about 25 nanometers. Alternatively, the cermet layer 36 can be fabricated of a dielectric material such as $TiO_2$ plus a high-work function metal, as described in U.S. Pat. No. 4,167,015, which patent is incorporated herein by reference.

An active layer 38 of hydrogenated amorphous silicon is deposited on and electrically contacts the cermet layer 36. The active layer 38 comprises regions 38a, 38b, and 38c of differing conductivity types. A first region 38a is doped with P type conductivity modifiers, such as boron. The region 38a is typically about 5 to about 40 nanometers thick, and it is preferably about 7 nanometers thick. Region 38b is comprised of intrinsic hydrogenated amorphous silicon typically having a thickness of about 30 to about 300 nanometers. Undoped or intrinsic hydrogenated amorphous silicon has been found to be of slightly N type conductivity, as described in U.S. Pat. No. 4,064,521 issued on Dec. 20, 1977 to Carlson, which is incorporated herein by reference. The region 38c is comprised of N type hydrogenated amorphous silicon. Typically it has a thickness of about 10 to about 40 nanometers, and it is contiguous to and deposited on region 38b. The preceding preferred thickness of the P type and the N type amorphous silicon layers are for materials made with dopant concentrations of 1 percent diborane ($B_2H_6$) in silane ($SiH_4$) and 2 percent phosphine ($PH_3$) in $SiH_4$, respectively. The dopant concentration in the gas may affect the optimum thickness of these regions.

A second active layer 42, similar to layer 38, comprises P type region 42a, intrinsic region 42b, and N type region 42c. Regions 42a, 42b and 42c may be deposited at a higher temperature than regions 38a, 38b, 38c so that layer 42 has a lower concentration of hydrogen and a lower energy bandgap than layer 38. The thickness of the second layer 42 should be adjusted so that the current produced in layer 42 is about equal to the current produced in layer 38, since the total current of the solar cell 20 will be limited to the lower of the currents of layer 38 and layer 42.

The tandem-junction solar cell of the present invention is not limited to two active layers. The solar cell can contain a plurality of active layers. Each active layer is joined to the adjacent active layer by a cell "interconnecting layer". The term "cell interconnecting layer" means a metal layer, a cermet layer, a combined metal and cermet layer, or a PN junction. Preferably, solar cell 20 has from 2 to 5 active layers wherein each active layer is separated by a tunnel junction or a cell "interconnecting layer" which functions as a tunnel junction.

A cell "interconnecting layer" 40 is situated between the active semiconductor layers 38 and 42. The cell "interconnecting layer" 40 provides a single electrical path through the first active layer 38 and the second active layer 42 to the back contact 44. The cell "interconnecting layer" 40 also permits the transmission of solar radiation which is not absorbed by the active region 38 to the second active region 42 or additional active region, where additional absorption can occur.

The "interconnecting layer" 40 is from about 2 to about 15 nanometers thick and is comprised of a Pt-$SiO_2$ cermet or a thin metal layer and a Pt-$SiO_2$ cermet, or a thin metal layer. If a thin metal layer is used, it can be comprised a metal such as platinum, titanium nickel, and like materials which forms a good ohmic contact with the N type layer of are transparent to solar radiation. If a thin metal layer is used without the cermet, it is preferable to use a high work-function metal such as platinum. The performance of a tandem-junction solar cell 20 is degraded if the "interconnecting layer" 40 is an insulator, in spite of the fact that said insulator could be thin enough to permit electrons to tunnel therethrough. The cell "interconnecting layer" functions like a tunnel junction between the active regions 38 and 42.

The "interconnecting layer" 40 can be omitted if region 38c and region 42a incorporate sufficient P type and N type conductivity modifiers, respectively, to form a tunnel junction therebetween.

The efficiency of converting light to electricity of a hydrogenated amorphous silicon solar cell of the above structure approaches a constant when the intrinsic region is about 500 nanometers thick. In a tandem-junction structure, any additional thickness of this region only serves to increase the absorption of solar radiation without an increase in cell performance, and robs any subsequent layers of solar radiation. Therefore, the thickness of each intrinsic region should be thinner as the number of stacked hydrogenated amorphous silicon layers increases. In addition, the thickness of each intrinsic region subsequent to the incident intrinsic region should be thicker than the previous region.

The back contact 44, which can be made of titanium, molybdenum, niobium and like materials, which are adherent to and form a good ohmic contact with region 42c, is deposited on said region. Ohmically contacting the back contact 44 and interconnecting solar cell 20 to the base substrate 34 of solar cell 21 is solar cell interconnection layer 46 of indium, tin, titanium, or like materials. Wires 52 and 54 contact layer 34 and 46, respectively, to withdraw the current generated during illumination of solar battery 10 by solar radiation 100.

Since solar cells 20, 21, and 22 are connected in series, the current remains constant and the voltage of each cell is cumulative. The addition of the voltages enables the fabrication of a solar cell with any desired voltage for a specific application. The solar cell interconnection layer 46 can be made as small as 0.5 percent of the total device area. Although the layer 46 in single-crystalline materials would create problems with the possible shorting of the solar cell structure 20, this is not a problem with amorphous silicon because the lateral conductivity of the doped layers is so poor that for practical purposes it is non-existent, i.e., the lateral conductivity of the amorphous semiconductor layers is similar to an insulator with the lateral sheet resistivity greater than about $10^{10}$ $\Omega/\square$.

When fabricating solar battery 10, the maximum width of the top electrode and solar cells 20, 21, and 22 is determined by the sheet resistivity of the TCO layer, the short circuit current density, $J_{sc}$, of the individual stacked solar cell strips, and a factor which relates to the power loss from each cell which is acceptable without a shielding grid electrode. A grid electrode is necessary where the power loss factor would be greater than about 0.05. The width should be maximized, but less than a width which would require a grid electrode to withdraw the current generated during the operation of the solar battery. More specifically, the width is determined according to the following formula $$W = \sqrt{\frac{3fV_{oc}F}{R_\square J_{sc} N}}$$

wherein $V_{oc}$ is the total open circuit voltage of the solar battery, $R_\square$ is the sheet resistivity of the incident electrode, F is the fill factor, $J_{sc}$ is the short circuit current density, N is the number of strips in the solar battery, and f is the factor related to the percentage of power lost in the front electrode due to resistive heating. The factor f is usually about 0.01 to about 0.08. In practical devices f is typically about 0.05. For the purposes of determining the width, it is assumed that only the front electrode, in the FIGURE electrode 34 is current-limiting because the back electrode 44 can be made thick enough so that sheet resistivity is not a consideration.

As an example, for $J_{sc}$ of 3 milliamps/cm$^2$, N of 9, $R_\square$ of 100 ohms/square, $V_{oc}$ of 12.5 volts, F of 0.6, and f of 0.05, the cell width becomes 0.65 cm. For a gap width of 0.005 cm, which can readily be made available by existing photolithographic techniques, the overall area of the solar battery which is not utilized is about 0.7 percent of the total solar battery area. This is greater than an order of magnitude better than a solar cell structure which requires a grid electrode for collection of the photocurrent. As should be apparent from the formula, as the resistance of the front electrode decreases, the width of the strips can increase without affecting the overall solar battery performance. If the width is kept constant, then the solar battery performance increases.

The solar battery may be fabricated by several methods. The substrate is coated with a TCO layer by evaporation or other methods known in the art such as sputtering or pyrolysis of inorganic or organometallic compounds. A TCO glass coated with ITO can also be purchased prefabricated from, among others, Saunders-Roe Developments Ltd., Millington Road, Hayes, Middlesex, England. The TCO is coated with a positive photoresist such as Shipley 1350-H. The resist is spun on, dried, and exposed to a light source through a photomask to define the grooves between the strips. The device is placed in an apparatus for aligning the mask which maintains the mask stationary and permits the device to move in the x, y, and z directions and also rotated around the geometric axis perpendicular to the plane of the sample. The apparatus described is known in the art. The pattern is developed in a suitable developer. The grooves are etched in the TCO with a suitable etchant such as 55–58 percent HI at 35° C. for ITO.

Thereafter, the cermet layer is fabricated in accordance with the teachings in the previously-mentioned U.S. Pat. No. 4,167,015. The TCO layer and the cermet layer can be selected so as to form a quarter wave antireflection coating, for example, 60 nanometers of TCO and 10 nanometers of Pt-SiO$_2$ cermet.

The hydrogenated amorphous silicon semiconductor layers 38 and 42 are deposited by a glow discharge of silane or other appropriate silicon and hydrogen-containing atmosphere as taught in the previously-mentioned Carlson patent and in U.S. Pat. No. 4,196,438, also incorporated herein by reference. Layers 38 and 42 can also be fabricated by an RF deposition system wherein the electrodes or coils are contained within the deposition chamber. Suitable parameters for the RF discharge are an RF power equal to or less than about 0.5 watt per square centimeter (W/cm$^2$), on a target having an area of about 160 centimeters squared, a gas pressure of from about 20 millitorr to about 50 millitorr, a silane flow rate of about 30 SCCM and a system temperature of from about 150° to about 320° C. The P type region of layer 38 or 42 is fabricated with a suitable P type dopant concentration of B$_2$H$_6$ or other suitable dopants in an amount of from about 0.01 to about 2 percent with respect to the volume of silane. The N type region is fabricated with a concentration of N type dopants such as PH$_3$ of about 0.1 to 4 percent of the deposition atmosphere. After the deposition of the active regions, the back electrode 44 is deposited by evaporation or RF sputtering or other suitable methods.

After the application of the back electrode 44, the solar battery is coated with a positive or negative photoresist. The individual cells are defined by exposing the surface of the photoresist through an appropriate photomask, i.e., positive or negative mask, and developing the resist by methods known in the art. The grooves are etched in the back electrode with a suitable etchant such as 1 part HF, 2 parts HNO$_3$, and 7 parts H$_2$O for a titanium electrode. The photoresist is stripped and a new layer of photoresist is applied, exposed to light and developed in accordance with the previously recited procedure.

The active layers and the cermet are etched away down to the TCO layer by RF plasma etching in an atmosphere consisting of CF$_4$ and 4 percent oxygen by volume. The plasma etches quickly through the active regions, but slowly at about 10 nm/min. through the cermet. If the cermet film is thicker than about 10 nm, the cermet layer can be etched with a reactive RF sputter etching method in a CF$_4$-O$_2$ or Ar-CF$_4$-O$_2$ atmosphere. The end point of the etching is determined usually by the appearance of clear transparent grooves down to the TCO layer.

Finally, the photoresist is removed and, optionally, the device surface is RF plasma-etched in oxygen to remove all traces of organic molecules prior to the deposition of the series "interconnecting layer". The series "interconnecting layer" is angle evaporated between the grooves at an angle of about 45 degrees with respect to the surface, perpendicular to the grooves and from the direction which interconnects the back electrode of solar cell 20 to the TCO layer of solar cell 21. The series "interconnecting layer" can also be applied by evaporation of the layer over the entire solar battery surface. Thereafter, the excess material is removed and the grooves are formed with photolithographic techniques described previously. After the photoresist is stripped and wires 52 and 54 are attached by known methods, the back of the solar battery can be encapsulated with a suitable material such as Apiezon W, a product of the James G. Biddle Co., Plymouth Metting, Pa.

The invention will be further illustrated by the following Example, but it is to be understood that the invention is not meant to be limited solely to the details described therein. Modifications which would be obvious to one of ordinary skill in the solar cell art are contemplated to be within the scope of the invention.

EXAMPLE

A soda-lime glass substrate about 7.6×7.6 centimeters and about 0.16 centimeter in thickness, having a coating of indium tin oxide with a sheet resistance of about 10 ohms/$\square$, was coated with a positive photoresist, such as Shipley 1350-H, a product of the Shipley Co., Inc., Newton, Mass., by spin coating at 4000 RPM for 30 seconds, and dried at a temperature of about 75° C. for about 1 hour. The photoresist was exposed through a photomask which defined 9 strips 7.6 centimeters long and 0.68 centimeter wide. The photoresist was developed in Shipley Developer and the soluble portion of the photoresist, defining the area between the previously recited strips, was removed. Thereafter, the exposed substrate was immersed in a 55–58 percent hydroiodic solution at 35° C. to remove the exposed indium tin oxide, leaving behind indium tin oxide photoresist-coated strips having a length of 7.6 centimeters and a width of 0.68 centimeter. The remaining photoresist was cleaned from the indium tin oxide strips and a Pt-SiO$_2$ cermet, having a metal content of about 12 volume percent platinum, was deposited onto the substrate to a thickness of about 23.5 nanometers by RF sputtering. Thereafter, an active semiconductor layer of hydrogenated amorphous silicon having a P type region of about 31.8 nanometers thick, an undoped region of about 181.6 nanometers thick, and an N type region of about 22.7 nanometers thick was deposited on the Pt-SiO$_2$ cermet. The hydrogenated amorphous silicon layer was formed by RF capacitive glow discharge of silane for the undoped layer and diborane gas in a concentration of about 0.1 volume percent for the P type region, and PH$_3$ gas in a concentration of about 0.2 volume percent for the N type region, the concentrations being with respect to silane.

A second Pt-SiO$_2$ cermet layer having a thickness of about 10.5 nanometers with a platinum concentration of about 12 volume percent was deposited on the first active region by RF sputtering. Thereafter, a second active semiconductor layer was deposited on said second cermet layer. The second semiconductor layer was fabricated in accordance with the procedure outlined for the first layer and had a P type region thickness of about 31.8 nanometers, an intrinsic region about 363.2 nanometers thick contiguous to said P type region, and an N type region about 90.8 nanometers thick contiguous to said intrinsic region. A back electrode of titanium about 200 nanometers thick was deposited by sputtering onto the N type region of the second active semiconductor layer. Thereafter, the device was coated with positive photoresists and exposed through a photomask to create a pattern which is similar to the strips fabricated in the indium tin oxide layer but displaced from the grooves in said indium tin oxide layer so as to enable the series interconnection of the tandem junction solar cell strips. The positive photoresist is Shipley 1350-H, a product of the Shipley Company. The exposed photoresist is developed and the soluble portion defining the grooves is removed with a solvent wash. The structure is then etched in a one part hydrofluoric acid, 2 part HNO$_3$, and 7 part water solution to remove the portion of the titanium back electrode which will form the grooves in the device. After etching the titanium, the photoresist was stripped with acetone and another coating of photoresist was applied and developed with the same alignment as the previous coating and developing. The device was placed in a plasma etching machine and the active layers underneath the titanium which had already been removed were etched in a CF$_4$ atmosphere containing four percent oxygen, i.e., DE-100 Freon purchased from the Scientific Gas Products, Inc., South Plainfield, N.J. The plasma etching machine was a device produced by the International Plasma Corporation, IPC-200 Series System, Hayward, Calif. The conditions used in the plasma etch were an RF power of about 800 watts, a CF$_4$-O$_2$ pressure of between 0.5 to 1 torr, a starting temperature of about 25° C. and a final temperature of less than or equal to about 90° C. These parameters resulted in an amorphous silicon etch rate of about 200 nanometers/minute. The etching is continued through the second active layer and the interconnect cermet tunnel junction, said layer etching at a rate of only about 10 nanometers per minute down to the indium tin oxide layer. The end point of the etching was determined visually because the substrate with the indium tin oxide appears transparent once the hydrogenated amorphous silicon is removed therefrom.

At this point in the fabrication, the device was checked for pinholes by shining a light through the device. The pinholes were covered with Microstop, a product marketed by the Michigan Chrome and Chemical Company, Detroit, Mich.

The series "interconnecting layer" of indium was isotropically evaporated over the titanium layer to a thickness of about 200 nanometers. Thereafter, the device was coated with a positive photoresist, Shipley 1350-H, and exposed through a photomask which was aligned so as to place the third set of grooves adjacent to and within the second set of grooves. The excess indium was subsequently removed by etching in a solution comprising one part concentrated HCl, one part 30 percent H$_2$O$_2$, and 6 parts water by volume. The remaining photoresist and Microstop were removed in an acetone wash, a water wash, a deionized water wash, and finally a drying of the device in an oven for about 30 minutes to one hour at 100° C.

Shorts and shunts in the device were removed in accordance with the procedures outlined in U.S. Pat. No. 4,166,918, incorporated herein by reference. The contact wires of a flexible copper wire were attached to the end electrodes with a silver epoxy.

The solar battery was illuminated with a light having an intensity of one sun, i.e., A.M. 1, using a tungsten-halogen projector lamp, such as Sylvania ELH, 300 watt, 120 volt lamp. The solar battery exhibited an overall open circuit voltage ($V_{oc}$) of about 12.6 volts, a fill factor (FF) of about 0.56, and a short circuit current density ($J_{sc}$) of about 1.82 ma/cm$^2$ with an overall efficiency of about 1.42 percent. Upon illumination with a light having an intensity of 2x A.M. 1, the overall efficiency of the cell increased from about 1.42 percent to about 1.45 percent and the fill factor increased from about 0.56 to about 0.57.

I claim:
1. An amorphous silicon solar battery comprising:
   (a) a transparent substrate having a major surface which is incident to solar radiation and an opposed major surface;
   (b) a plurality of spaced apart transparent conductive oxide strips on said opposed major surface;
   (c) a plurality of tandem-junction, hydrogenated amorphous silicon solar cells fabricated over and electrically contacting a major portion of each of said transparent conductive oxide strips, said solar cells having a plurality of semiconductor layers of hydrogenated amorphous silicon having regions of differing conductivity type wherein said layers are separated by a tunnel junction, said solar cells having width such that the loss of power is less than the loss of power from the incorporation of a metallic grid electrode into the transparent conductive oxide; and
   (d) means for interconnecting said solar cells in series.

2. The solar battery according to claim 1, wherein said layers of hydrogenated amorphous silicon have a region of P type conductivity which forms the incident region of said layer, a region of intrinsic amorphous silicon contiguous to said P type region and a region of N type conductivity contiguous to said intrinsic region.

3. The solar battery according to claim 2 wherein said tunnel junction is formed between the N type region of an incident layer of amorphous silicon and the P type region of the subsequent layer of amorphous silicon.

4. The solar battery according to claim 3 wherein said means for connecting said solar cells in series is an electrically conductive material, wherein said electrically conductive material contacts a side of said solar cell and a surface of said solar cell opposite to a surface which is incident to solar radiation and an adjacent transparent conductive oxide strip.

5. The solar battery according to claim 3 wherein said tunnel junction is a layer of Pt-SiO$_2$ cermet.

6. The solar battery according to claim 3 wherein said tunnel junction is a layer of Pt-SiO$_2$ cermet and a transparent metal layer.

7. The solar battery according to claim 6 wherein said transparent metal layer is disposed between said cermet and said N type region of the semiconductor layer.

8. The solar battery according to claim 2 wherein the thickness of each intrinsic region of each semiconductor layer increases from the incident semiconductor layer.

9. The solar battery according to claim 8, wherein said means for interconnecting said solar cells in series is a metal layer.

10. The solar battery according to claim 1 wherein said means for interconnecting said solar cells in series is a metal layer.

11. The solar battery according to claim 1 wherein said means for connecting said solar cells in series is an electrically conductive material, wherein said electrically conductive material contacts a side of said solar cell and a surface of said solar cell opposite to a surface which is incident to solar radiation and an adjacent transparent conductive oxide strip.

12. The solar battery according to claim 1 wherein the energy bandgap of said semiconductor layers decreases from the incident semiconductor layer to subsequent semiconductor layers.

13. The solar battery according to claim 10, wherein the tandem-junction solar cells have from 2 to 5 semiconductor layers.

14. The solar battery according to claim 1 wherein the width of each tandem junction solar cell strip is determined according to the following formula:

$$W = \sqrt{\frac{3fV_{oc}F}{R_\Box J_{sc}N}}$$

wherein $V_{oc}$ is the total open circuit voltage of the solar battery, $J_{sc}$ is the short circuit current density, F is the fill factor, $R_\Box$ is the sheet resistivity of the transparent conductive oxide, N is the number of solar cell strips in the solar battery, and f is a factor related to the percentage of power lost in the front electrode and is selected so as to be less than the power loss of a grid electrode due to the shielding effect of said grid electrode.

15. The solar battery according to claim 14 wherein W is from about 0.2 cm to about 5.0 cm.

16. The solar battery according to claim 15 wherein W is from about 0.2 cm to about 2.0 cm.

* * * * *